US012701691B2

(12) United States Patent
Kim

(10) Patent No.: US 12,701,691 B2
(45) Date of Patent: Aug. 4, 2026

(54) SEMICONDUCTOR DEVICE AND METHOD FOR FABRICATING THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 687 days.

(21) Appl. No.: 17/989,125

(22) Filed: Nov. 17, 2022

(65) Prior Publication Data

US 2023/0413518 A1 Dec. 21, 2023

(30) Foreign Application Priority Data

Jun. 20, 2022 (KR) ........................ 10-2022-0074631

(51) Int. Cl.
H10B 12/00 (2023.01)
G11C 8/14 (2006.01)

(52) U.S. Cl.
CPC ............. H10B 12/312 (2023.02); G11C 8/14 (2013.01)

(58) Field of Classification Search
CPC ...... H10B 12/488; H10B 12/48; H10B 12/50; G11C 8/14
See application file for complete search history.

(56) References Cited

U.S. PATENT DOCUMENTS

| | | | | |
|---|---|---|---|---|
| 2015/0255484 A1* | 9/2015 | Imamura | ............. | H01L 21/0228 257/314 |
| 2017/0338240 A1* | 11/2017 | Nogami | ................. | H10B 43/35 |
| 2020/0098788 A1* | 3/2020 | Oh | ......................... | H10B 43/10 |

FOREIGN PATENT DOCUMENTS

| | | |
|---|---|---|
| KR | 10-2020-0034361 A | 3/2020 |
| KR | 10-2022-0050602 A | 4/2022 |

OTHER PUBLICATIONS

Office Action for Korean Patent Application No. 10-2022-0074631 issued by the Korean Patent Office on Jan. 12, 2026.

* cited by examiner

*Primary Examiner* — Tucker J Wright
(74) *Attorney, Agent, or Firm* — IP & T GROUP LLP

(57) ABSTRACT

A semiconductor device includes: a plurality of word line pad portions that are stacked over a lower structure in a direction perpendicular to a surface of the lower structure; horizontal-level dielectric layers between the word line pad portions; and bridge prevention layers disposed between the word line pad portions and covering ends of the horizontal-level dielectric layers.

23 Claims, 11 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No, 10-2022-0074631, filed on Jun. 20, 2022, which is incorporated herein by reference in its entirety.

BACKGROUND

1. Field

The present invention relates generally to a semiconductor device, and more particularly, to a semiconductor device including three-dimensional memory cells, and a method for fabricating the same.

2. Description of the Related Art

Recently, in order to cope with demand for larger capacity miniaturized memory devices, various technologies and methods have been proposed providing three-dimensional (3D) memory devices in which memory cells are stacked in various 3D arrangements.

SUMMARY

Various embodiments of the present invention are directed to a 3D semiconductor device (hereinafter referred to simply as a semiconductor device) including highly integrated memory cells, and a method for fabricating the semiconductor device.

In accordance with an embodiment of the present invention, a semiconductor device may include: a plurality of word line pad portions stacked over a lower structure in a direction perpendicular to a surface of the lower structure; dielectric layers disposed between the word line pad portions; and bridge prevention layers disposed between the word line pad portions and covering ends of the dielectric layers.

In accordance with another embodiment of the present invention, a semiconductor device may include: a word line stack including a plurality of word lines stacked over a lower structure in a direction perpendicular to a surface of the lower structure; a word line pad portion defined at an end of the word line stack; dielectric layers disposed between the word line pad portions; bridge prevention layers disposed between the word line pad portions and covering ends of the dielectric layers; and contact plugs respectively coupled to the word line pad portions.

In accordance with yet another embodiment of the present invention, a method for fabricating a semiconductor device may include: forming a cell stack body that includes a first cell isolation dielectric layer, a first sacrificial dielectric layer, a semiconductor layer pattern, a second sacrificial dielectric layer, and a second cell isolation dielectric layer over a lower structure; forming a stepped structure by etching the cell stack body; forming recesses that expose bridge prevention layers and the semiconductor layer pattern by selectively recessing the first and second sacrificial dielectric layers; forming word lines that fill the recesses; forming pad-type openings by removing the semiconductor layer pattern between the word lines; and forming pads that fill the pad-type openings. The bridge prevention layers cover ends of the first and second cell isolation dielectric layers. The bridge prevention layers may include a dielectric material. The method for fabricating a semiconductor device further comprising forming a passivation layer that covers ends of the stepped structure. The bridge prevention layers and the passivation layer may include the same material.

DETAILED DESCRIPTION

Figure 1:
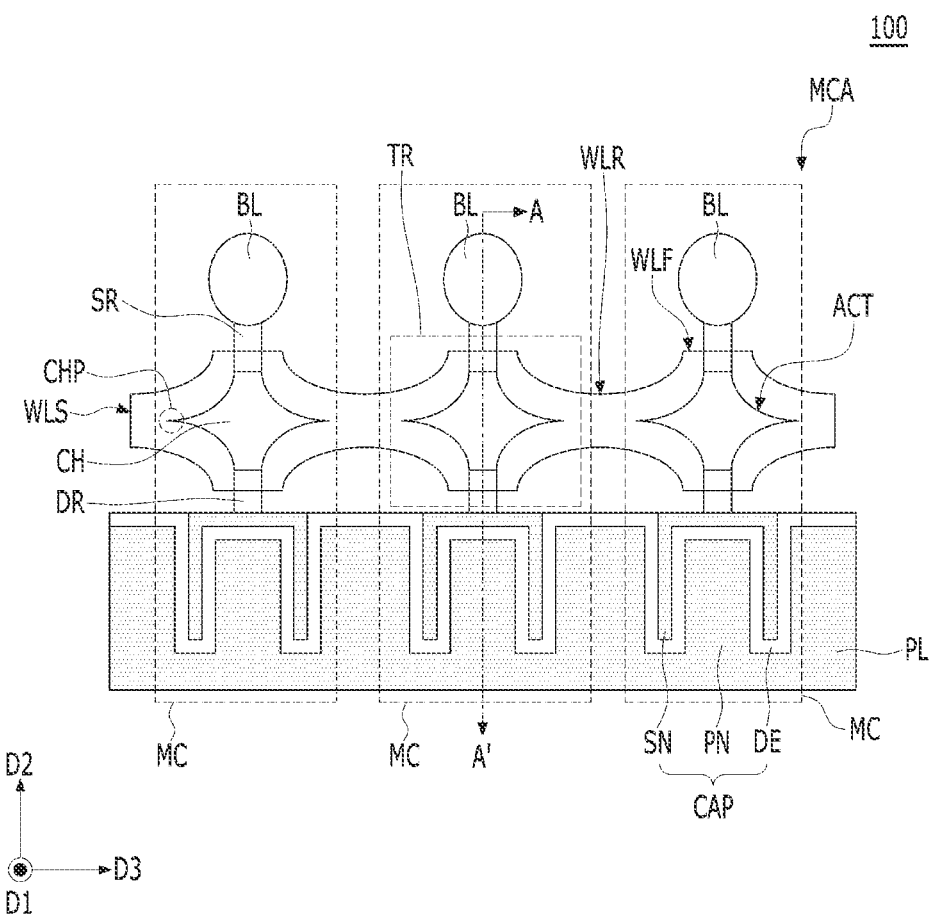
FIG. 1 is a schematic plan view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to dearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, it is possible to increase the memory cell density and reduce parasitic capacitance by vertically stacking memory cells.

Figure 2:
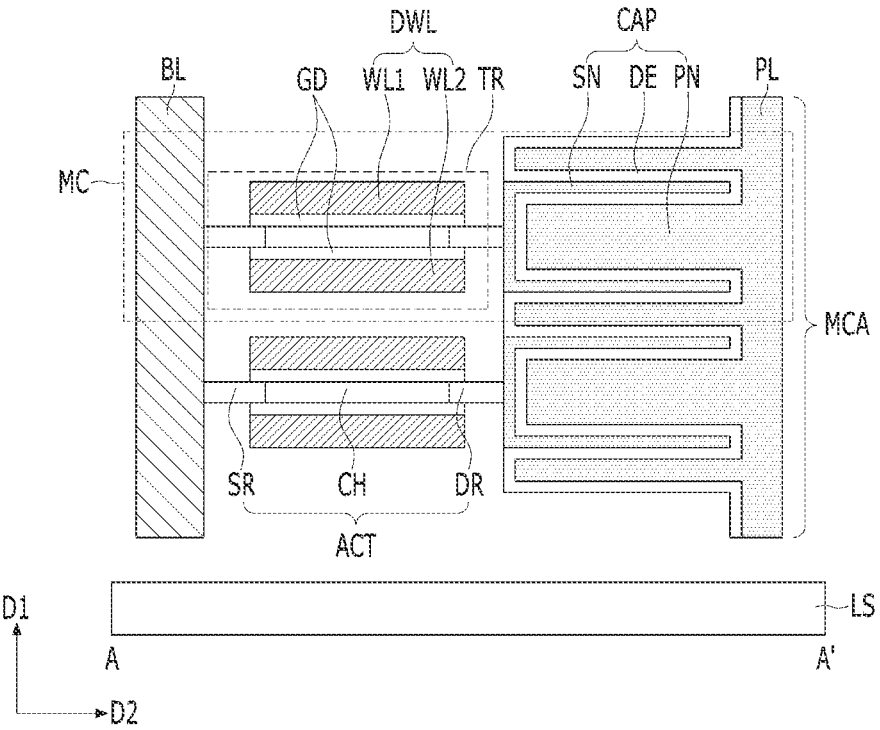
FIG. 2 is a cross-sectional view taken along a line A-A' shown in FIG. 1.

FIG. 1 is a schematic plan view illustrating a semiconductor device in accordance with an embodiment of the present invention, FIG. 2 is a cross-sectional view taken along a line A-A' shown in FIG.

Referring to FIGS. 1 and 2, the semiconductor device 100 may include a memory cell array MCA, and the memory cell array MCA may include a plurality of memory cells MC. The memory cell array MCA may include a three-dimensional array of memory cells MC. The three-dimensional array of memory cells MC may include a column array and a row array. FIG. 1 illustrates a row array of memory cells MC laterally arranged along a third direction D3, and FIG. 2 illustrates a column array of memory cells MC stacked in a first direction D1. The memory cell array MCA may include a row array of memory cells MC laterally arranged in a second direction D2.

The memory cell array MCA may include a word line stack WLS, a plurality of bit lines BL, a plurality of transistors TR, and a plurality of capacitors CAP. The memory cell array MCA may share one word line stack WLS. Each memory cell MC may include a bit line BL, a transistor TR, and a capacitor CAP.

Each transistor TR may include an active layer ACT and a word line DWL. The word line DWL may include a double word line structure. The double word line structure of the word line DWL may include a pair of a first word line WL1 and a second word line WL2. The first word line WL1 and the second word line WL2 may face each other perpendicularly in the first direction D1 with the active layer ACT interposed therebetween. In other words, the first word line WL1 and the second word line WL2 may be arranged along the first direction D1 spaced apart from each other and facing each other with the active layer ACT disposed therebetween. The first word line WL1 may be referred to as an upper-level (or top) word line, and the second word line WL2 may be referred to as a log ter-level (or bottom) word line.

Each capacitor CAP may include a storage node SN, a dielectric layer DE, and a plate node PN.

The bit line BL may have a pillar shape extending in the first direction D1. The active layer ACT may have a bar shape extending in the second direction D2 intersecting with the first direction D1. The word line DWL may have a line shape extending in a third direction D3 intersecting with the first and second directions D1 and D2. The plate nodes PN of the capacitors CAP may be coupled to each other to be coupled to a plate line PL.

The bit line BL may be vertically oriented in a first direction D1. The bit line BL may be referred to as a vertically oriented bit line or a pillar-type bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, titanium disilicide (also known as titanium silicide), nickel silicide, or a combination thereof. For example, the bit line BL may include polysilicon or titanium nitride (TiN) which is doped with an N-type impurity. The bit line BL may include a TiN/W stack including titanium nitride and tungsten over titanium nitride.

The word line DWL may extend in the third direction D3 while the active layer ACT may extend in the second direction D2. The active layer ACT may be laterally arranged in the second direction D2 from the bit line BL. A gate dielectric layer GD may be formed on the upper and lower surfaces of the active layer ACT.

The transistor TR may be a cell transistor and may include the word line DWL. In the word line DWL, the same voltage may be applied to the first word line WL1 and the second word line WL2. For example, the first word line WL1 and the second word line WL2 may form a pair, and the same word line driving voltage may be applied to the first word line WL1 and the second word line WL2. As such, the memory cell MCA according to the embodiment of the present invention may have the word line DWL having a double word line structure in which the first and second word lines WL1 and WL2 are disposed adjacent to one active layer ACT.

The active layer ACT may include a semiconductor material. The active layer ACT may include a silicon-containing layer or a silicon germanium-containing layer. For example, the active layer ACT may include silicon, monocrystalline silicon, doped polysilicon, undoped polysilicon, amorphous silicon, silicon germanium, or a combination thereof. According to another embodiment of the present invention, the active layer ACT may include a nano-wire or a nano sheet, and the nano-wire and the nano sheet may be formed of a semiconductor material. According to another embodiment of the present invention, the active layer ACT may include an oxide semiconductor material such as indium gallium zinc oxide (IGZO). The active layer ACT may include a channel CH, a first source/drain region SR, and a second source/drain region DR. The first source drain region SR and the second source/drain region DR may be formed in the active layer ACT by ion implantation of impurities or plasma doping. The channel CH may vertically overlap with the first and second word lines WL1 and WL2. The channel CH may include channel protrusions CHP that are symmetrical to each other in the third direction D3. The channel protrusions CHP may vertically overlap with the first and second word lines WL1 and WL2.

Each of the first and second word lines WL1 and WL2 may include notched sidewalls facing each other. The notched sidewall may include flat surfaces WLF and recessed surfaces WLR. The flat surfaces WLF and the recessed surfaces WLR may be alternately repeated along the third direction D3. The flat surfaces WLF may be flat sidewalls, and the recessed surfaces WLR may be recessed sidewalls. The flat surfaces WLF may vertically overlap with the first and second source/drain regions SR and DR. The recessed surfaces WLR may not overlap with the first and second source/drain regions SR and DR. The flat surfaces WLF may face each other in the second direction D2. In the second direction D2, the recessed surfaces WLR may face each other. The recessed surfaces WLR may have an angled shape or a rounded shape.

The active layer ACT may have a thickness thinner than the thicknesses of the first and second word lines WL1 and WL2. In other words, the vertical thickness of the active layer ACT in the first direction D1 may be thinner than the vertical thickness of each of the first and second word lines WL1 and WL2 in the first direction D1. As such, the thin active layer ACT may be referred to as a thin-body active layer.

The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

The word line DWL may include a metal-based material, a semiconductor material, or a combination thereof. The word line DWL may include, for example, titanium nitride, tungsten, polysilicon, or a combination thereof. For example, the word line DWL may include a TiN/W stack in which titanium nitride and tungsten are sequentially stacked. The word line DWL may include an N-type work function material or a P-type work function material. The N-type work function material may have a low work function of approximately 4.5 eV or less, and the P-type work function material may have a high work function of approximately 4.5 eV or more.

The capacitor CAP may be disposed laterally from the transistor TR in the second direction D2. The capacitor CAP may include a storage node SN that extends laterally from the active layer ACT in the second direction D2. The capacitor CAP may further include a dielectric layer DE and a plate node PN over the storage node SN. The storage node SN, the dielectric layer DE, and the plate node PN may be arranged laterally in the second direction D2, The storage node SN may have a laterally oriented cylinder shape. The dielectric layer DE may conformally cover the cylindrical inner wall and the cylindrical outer wall of the storage node SN. The plate node PN may have a shape extending to the cylindrical inner wall and the cylindrical outer wall of the storage node SN over the dielectric layer DE. The plate node PN may be coupled to the plate line PL. The storage node SN may be electrically connected to the second source/drain region DR.

The storage node SN may have a three-dimensional structure. The storage node SN of the three-dimensional structure may have a lateral three-dimensional structure which is oriented in the second direction D2. As an example of the three-dimensional structure, the storage node SN may have a cylinder shape. According to another embodiment of the present invention, the storage node SN may have a pillar shape or a pylinder shape. The pylinder shape may refer to a structure in which a pillar shape and a cylinder shape are merged.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/Site/WN), In the titanium nitride/silicon germanium/tungsten nitride (TiN/SiGe/WN) stack, silicon germanium may be a gap-fill material filling the cylindrical inside of the storage node SN over the titanium nitride, and titanium nitride (TiN) may serve as a plate node PN of a capacitor CAP, and tungsten nitride may be a low-resistance material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (HO-based oxide. The dielectric layer DE may have a stack structure including at least hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAMA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material.

According to another embodiment of the present invention, an interface control layer for improving leakage current may be further formed between the storage node SN and the dielectric layer DE. The interface control layer may include titanium oxide ($TiO_2$), niobium oxide, or niobium nitride. The interface control layer may also be formed between the plate node PN and the dielectric layer DE.

The capacitor CAP may include a metal-insulator-metal (MIM) capacitor.

The capacitor CAP may be replaced with another data storage material. For example, the data storage material may be a phase change material, a magnetic tunnel junction (MT)), or a variable resistance material.

Active layers ACT stacked in the first direction D1 may share one bit line BL. Active layers ACT stacked in the first direction D1 may be in common contact with one bit line BL. The active layers ACT disposed adjacent to each other in the third direction D3 may share one word line DWL. The capacitors CAP may be coupled to the active layers ACT, respectively. The capacitors CAP may share one plate line PL. The individual active layers ACT may be thinner than each of the first and second word lines WL1 and WL2 of the word line DWL.

In the memory cell array MCA, a plurality of word lines DWL may be vertically stacked in the first direction D1. Each individual word line DWL may include a pair of a first word line WL1 and a second word line WL2. Between the first word line WL1 and the second word line WL2, a plurality of active layers ACT may be laterally arranged to be spaced apart from each other in the third direction D3.

The lower structure LS may be formed of a material appropriate for semiconductor processing. The lower structure LS may include at least one among a conductive material, a dielectric material, and a semiconductor material. The lower structure LS may include a semiconductor substrate, and the semiconductor substrate may be formed of a silicon-containing material. The lower structure LS may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The lower structure LS may also include another semiconductor material, such as germanium. The lower structure LS may include a III/V-group semiconductor substrate, for example, a compound semiconductor substrate, such as GaAs. The lower structure LS may include a Silicon-On-Insulator (SOI) substrate.

According to another embodiment of the present invention, the lower structure LS may further include peripheral circuits. The peripheral circuits may include a plurality of peripheral circuit transistors. The peripheral circuits may be disposed at a lower-level than the memory cell array MCA. This may be referred to as a COP (Cell over PERI) structure. The peripheral circuits may include at least one control circuit for driving the memory cell array MCA. The at least one control circuit of the peripheral circuits may include an N-channel transistor, a P-channel transistor, a CMOS circuit, or a combination thereof. The at least one control circuit of the peripheral circuits may include an address decoder circuit, a read circuit, a write circuit, and the like. The at least one control circuit of the peripheral circuits may include a planar channel transistor, a recess channel transistor, a buried gate transistor, a fin channel transistor (FinFET), etc.

For example, the peripheral circuits may include sub-word line drivers and a sense amplifier. The word lines DWL may be coupled to sub-word line drivers. The bit lines BL may be coupled to the sense amplifier.

Figure 3:
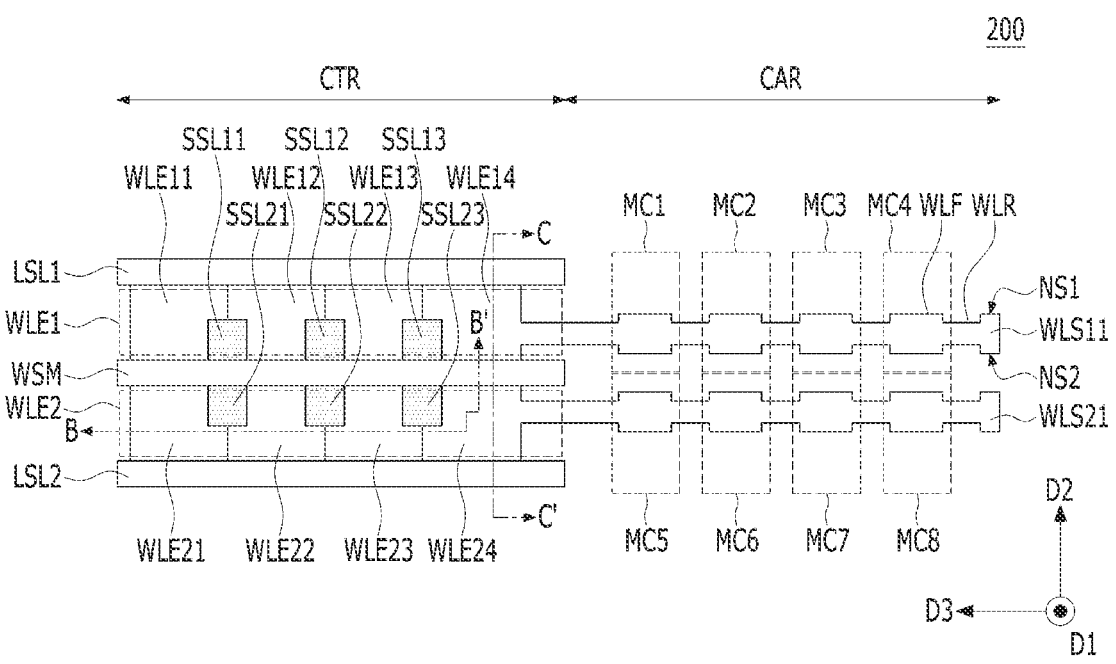
FIG. 3 is a schematic plan view illustrating a semiconductor device in accordance with another embodiment of the present invention.
Figure 4:
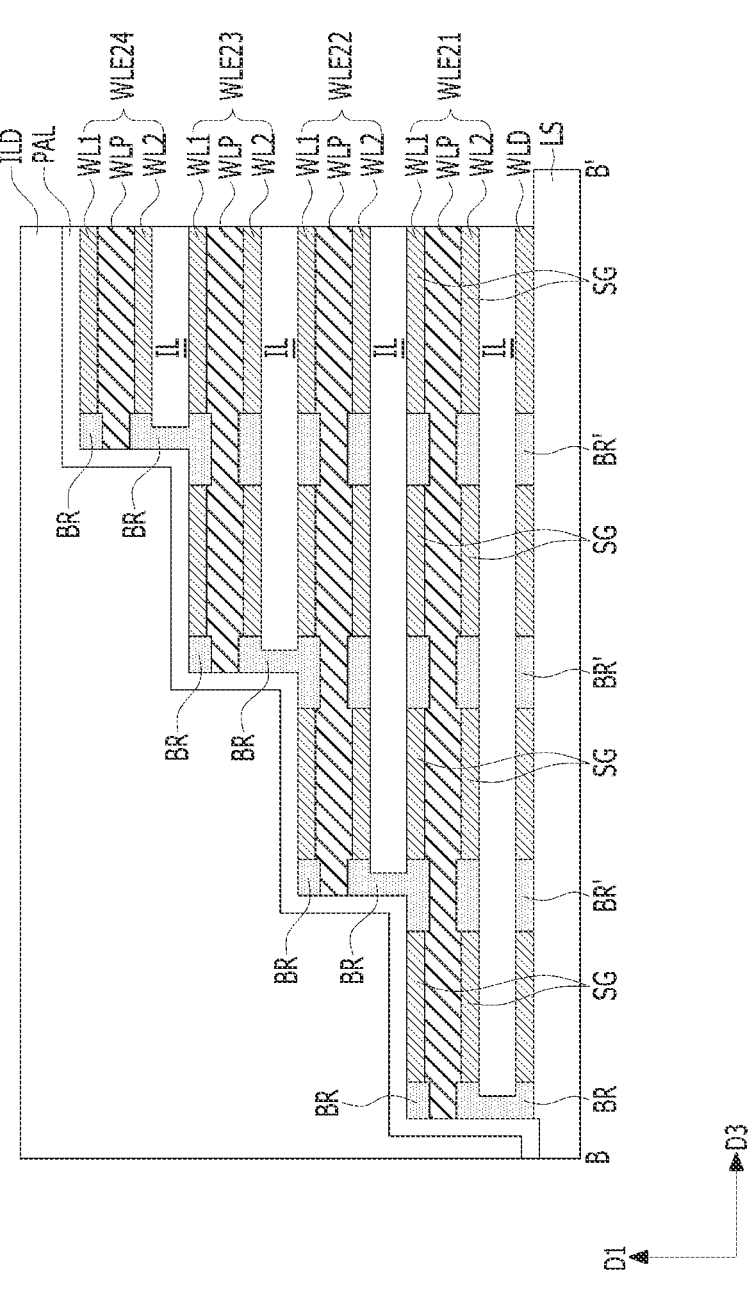
FIG. 4 is a cross-sectional view taken along a line B-B' shown in FIG. 3.
Figure 5:
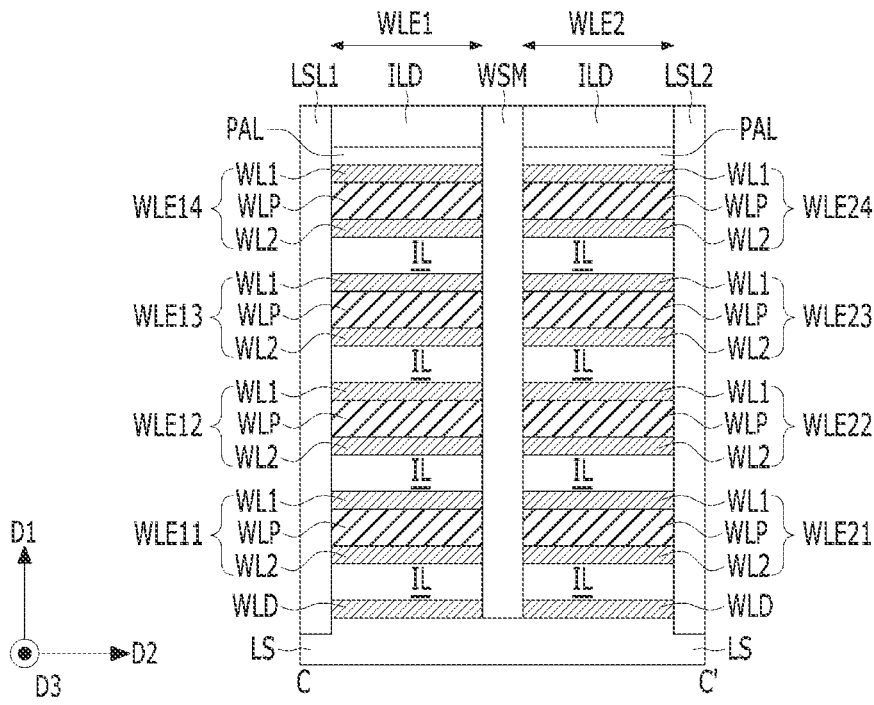
FIG. 5 is a cross-sectional view taken along a line C-C' shown in FIG. 3.
Figure 6:
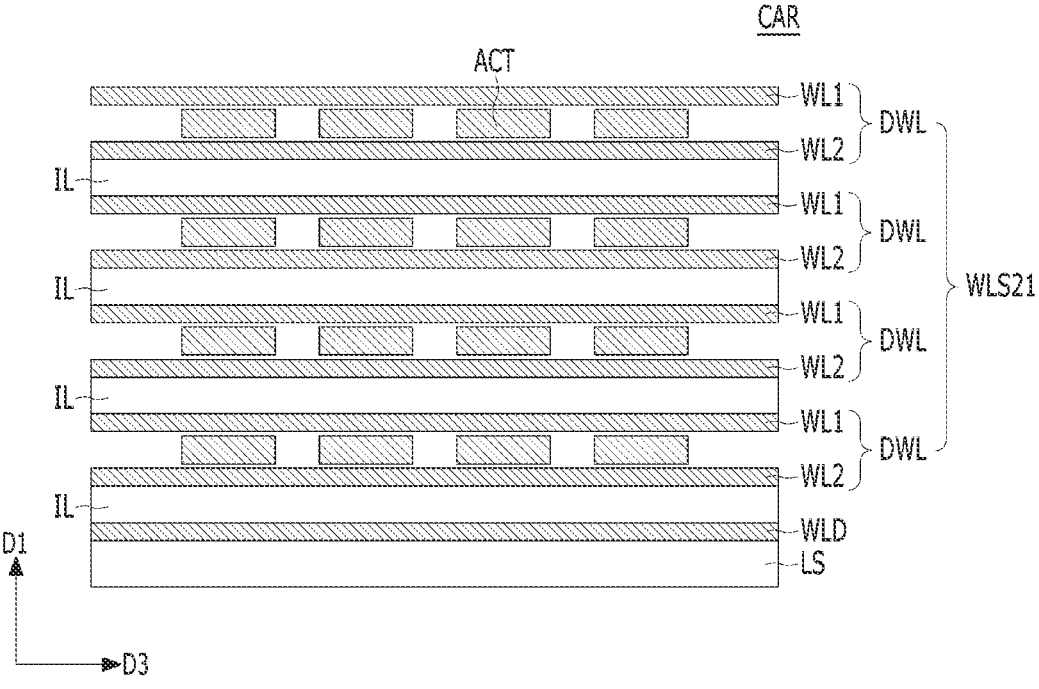
FIG. 6 is a partial detailed view of a cell array portion.

FIG. 3 is a schematic plan view illustrating a semiconductor device in accordance with another embodiment of the present invention, FIG. 4 is a cross-sectional view taken along a line B-B' shown in FIG. 3. FIG. 5 is a cross-sectional view taken along a line C-C' shown in FIG. 3, FIG. 6 is a partial detailed view of a cell array portion. The semiconductor device 200 may be similar to the semiconductor device 100 of FIG. 1. Hereinafter, detailed descriptions on the components also appearing in FIG. 1 will be omitted.

Referring to FIGS. 3 to 6, the semiconductor device 200 may include a cell array portion CAR and a contact portion CTR. The cell array portion CAR may be a region in which the memory cell array MCA of FIG. 1 is formed. The cell array portion CAR may include a plurality of memory cells MC1 to MC8 and a plurality of word line stacks WLS11 and WLS21. The first group of memory cells MC1, MC2, MC3, and MC4 may share the first word line stack WLS11. The second group of memory cells MC5, MC6, MC7, and MC8 may share the second word line stack WLS21, The first and second word line stacks WLS11 and WLS21 may each include first and second notched sidewalls NS1 and NS2.

The first and second notched sidewalls NS1 and NS2 may include a plurality of flat surfaces WLF and a plurality of recessed surfaces WLR.

Each of the word line stacks WLS11 and WLS21 may include a plurality of word lines DWL. For example, in each of the word line stacks WLS11 and WLS21, four word lines DWL may be stacked in the first direction D1. Each of the word lines DWL may include a first word line WL1 and a second word line WL2, Horizontal-level dielectric layers IL may be disposed between the word lines DWL. Active layers ACT may be disposed between the first word line WL1 and the second word line WL2 in the cell array portion CAR.

The word line stacks WLS11 and WLS21 may extend from the cell array portion CAR to the contact portion CTR. In other words, the word line stacks WLS11 and WLS21 may include word line edge portions WLE1 and WLE2 disposed in the contact portion CTR, respectively.

Each of the word line edge portions WLE1 and WLE2 may have a stepped structure including a plurality of word line pad portions. The first word line edge portion WLE1 may include first to fourth word line pad portions WLE11, WLE12, WLE13, and WLE14. The second word line edge portion WLE2 may include first to fourth word line pad portions WLE21, WLE22, WLE23, and WLE24. The lateral length may gradually decrease as it goes from the lowermost level first word line pad portions WLE11 and WLE21 toward the uppermost fourth word line pad portions WLE14 and WLE24. Here, the lateral length may refer to the length in the third direction D3. The first word line edge portion WLE1 may further include a dummy word line pad portion WLD disposed below the first word line pad portions WLE11 and WLE21.

The semiconductor device 200 may further include a word line separation slit WSN1, large slits LSL1 and LSL2, and small slits SSL11 to SSL13 and SSL21 to SSL23. The first word line edge portion WLE1 and the second word line edge portion WLE2 may be disposed between the first large slit LSL1 and the second large slit LSL2, and the word line separation slit WSM may be disposed between the first word line edge portion WLE1 and the second word line edge portion WLE2. The first word line edge portion WLE1 may contact the first group of small slits SSL11, SSL12, and SSL13. The second word line edge portion WLE2 may contact the second group of small slits SSL21, SSL22, and SSL23. The first and second groups of the first small slits SSL11 and SSL21 may be disposed between the first word line pad portions WLE11 and WLE21 and the second word line pad portions WLE12 and WLE22. The first and second groups of the second small slits SSL12 and SSL22 may be disposed between the second word line pad portions WLE12 and WLE22 and the third word line pad portions WLE13 and WLE23. The first and second groups of the third small slits SSL13 and SSL23 may be disposed between the third word line pad portions WLE13 and WLE23 and the fourth word line pad portions WLE14 and WLE24. The first and second groups of small slits SSL11 to SSL14 and SSL21 to SSL24 may extend vertically in the first direction D1. The first large slit LSL1, the second large slit LSL2, and the word line separation slit WSM may be spaced apart from each other in the second direction D2. The first large slit LSL1, the second large slit LSL2, and the word line separation slit WSM may extend in the third direction D3. The first direction D1, the second direction D2, and the third direction D3 may intersect with each other, Each of the word line stacks WLS11 and WLS21 may extend in the third direction D3.

The small slits SSL11 to SSL14, SSL21 to SSL24, the first large slit LSL1, the second large slit LSL2, and the word line separation slit WSM may be formed of a dielectric material. For example, the small slits SSL11 to SSL14, SSL21 to SSL24, the first large slit LSL1, the second large slit LSL2, and the word line separation slit WSM may include silicon oxide, silicon carbon oxide, silicon nitride, a low-k material, or combinations thereof. The small slits SSL11 to SSL14 and SSL21 to SSL24 may directly contact the first and second word line edge portions WLE1 and WLE2, According to another embodiment of the present invention, the small slits SSL11 to SSL14 and SSL21 to SSL24 may not contact the first and second word line edge portions WLE1 and WLE2. The first large slit LSL1, the second large slit LSL2, and the word line separation slit WSM may directly contact the first and second word line edge portions WLE1 and WLE2. The first large slit LSL1, the second large slit LSL2, and the word line separation slit WSM may be isolation layers that isolate the first word line edge portion WLE1 and the second word line edge portion WLE2 from each other. The small slits SSL11 to SSL14, SSL21 to SSL24, the first large slit LSL1, the second large slit LSL2, and the word line separation slit WSN1 may be supporters that support the first and second word line edge portions WLE1 and WLE2. The small slits SSL11 to SSL14 and SSL21 to SSL24 may be referred to as pillar-type slits, and the large slits LSL1 and LSL2 may be referred to as linear slits.

The first word line edge portion WLE1 may further include horizontal-level dielectric layers IL disposed between the word line pad portions WLE11 to WLE14, The second word line edge portion WLE2 may further include horizontal-level dielectric layers IL disposed between the word line pad portions WLE21 to WLE24. The horizontal-level dielectric layers IL may extend from the cell array portion CAR to the contact portion CTR.

A passivation layer PAL and an inter-layer dielectric layer ILD may be formed over the uppermost horizontal-level dielectric layer IL, The passivation layer PAL may extend to cover the ends and a portion of the upper surface of the word line pad portions WLE11 to WLE14 and WLE21 to WLE24.

Referring back to FIGS. 3 and 4, each of the word line pad portions WLE11 to WLE14 and WLE21 to WLE24 may include a first word line WL1, a second word line WL2, and a pad WLP. The pad WLP may be disposed between the first word line WL1 and the second word line WL2. The first word line WL1 and the second word line WL2 may be electrically connected to each other by the pad WLP. The first word line WL1, the second word line WL2, and the pad WLP may be formed of the same material. The pad WLP may include a metal-based material. The pad WLP may include, for example, titanium nitride, tungsten, or a combination thereof.

The end of the pad WLP may have a shape that protrudes more than the ends of the first and second word lines WL1 and WL2, An end of the pad WLP may be covered with bridge prevention layers BR and a passivation layer PAL, The upper surface of one end of the pad WLP may be covered with bridge prevention layers BR, and one side surface of one end of the pad WLP may be covered with a passivation layer PAL. The bridge prevention layers BR may include a dielectric material. The bridge prevention layers BR may include silicon nitride.

In word line pad portions WLE11 to WLE14 and WLE21 to WLE24, a plurality of bridge prevention layers BR in the third direction D3 may cover the upper surface and the lower surface of the pad WLP.

The word line pad portions WLE11 to WLE14 and WLE21 to WLE24 may include a conductive material. The word line pad portions WLE11 to WLE14 and WLE21 to WLE24 may include a metal, a metal alloy, or a semiconductor material. The word line pad portions WLE11 to WLE14 and WLE21 to WLE24 may include, for example, titanium nitride, tungsten, polysilicon, or a combination thereof. For example, the word line pad portions WLE11 to WLE14 and WLE21 to WLE24 may include a TiN/W stack in which titanium nitride and tungsten are sequentially stacked.

Referring to FIG. 4, the pad WLP of the upper-level word line pad portion WLE24 and the pad WLP of the lower-level word line pad portion WLE23 may be disposed vertically, A horizontal-level dielectric layer IL may be disposed between the pad WLP of the upper-level word line pad portion WLE24 and the pad WLP of the lower-level word line pad portion WLE23. A short between the upper-level word line pad portion WLE24 and the lower-level word line pad portion WLE23 may be prevented by the bridge prevention layers BR.

For example, a short between the lower-level word line WL2 of the upper-level word line pad portion WLE24 and the upper-level word line WL1 of the lower-level word line pad portion WLE23 may be prevented by the bridge prevention layer BR. Each of the upper-level word line WL1 and the lower-level word line WL2 may include a plurality of segments SG arranged in the third direction D3, and additional bridge prevention layers BR' may be alternately arranged between the segments SG of the upper-level word line WL1 and the lower-level word line WL2. The bridge prevention layers BR may be stepped bridge prevention layers that cover the ends of the horizontal-level dielectric layers IL, and the additional bridge prevention layers BR' may be flat-type bridge prevention layers that are disposed between the segments SG of the upper-level word line WL1 and the lower-level word line WL2, The bridge prevention layers BR and the additional bridge prevention layers BR' may be of the same material.

FIGS. 7 to 17 illustrate an example of a method for fabricating a semiconductor device in accordance with an embodiment of the present invention, FIGS. 7 to 17 illustrate a fabrication method of a semiconductor device taken along a line B-B' shown in FIG. 3.

Figure 7:
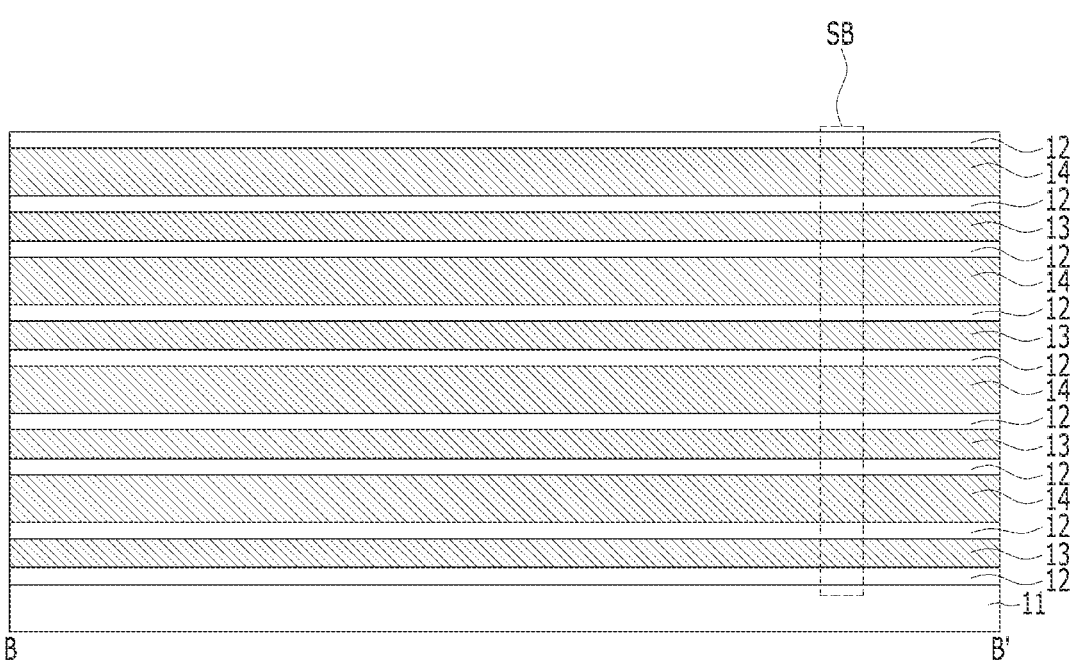
FIGS. 7 to 17 illustrate an example of a method for fabricating a semiconductor device in accordance with an embodiment of the present invention.

Referring to FIG. 7, a stack body SB may be formed over a lower structure including a substrate 11. The substrate 11 may include a semiconductor substrate. The stack body SB may include a plurality of sacrificial semiconductor layers 12 and a plurality of semiconductor layers 13 and 14, In the stack body SB, the sacrificial semiconductor layers 12 and the semiconductor layers 13 and 14 may be alternately stacked one by one.

The semiconductor layers 13 and 14 may include first semiconductor layers 13 and second semiconductor layers 14. The first semiconductor layers 13 may be thinner than the second semiconductor layers 14. The second semiconductor layers 14 may be approximately 2 to 3 times as thick as the first semiconductor layers 13. For example, the first semiconductor layers 13 may have a thickness of approximately 20 nm, and the second semiconductor layers 14 may have a thickness of approximately 40 nm.

The sacrificial semiconductor layers 12 may have the same thickness. The sacrificial semiconductor layers 12 may be thinner than the first and second semiconductor layers 13 and 14, The sacrificial semiconductor layers 12 may have a thickness of approximately 7 to 10 nm.

According to another embodiment of the present invention, the semiconductor layers 13 and 14 may be formed by changing the order of the first semiconductor layers 13 and the second semiconductor layers 14. In other words, the first semiconductor layers 13 may be thicker than the second semiconductor layers 14. The first semiconductor layers 13 may be approximately 2 to 3 times as thick as the second semiconductor layers 14. For example, the first semiconductor layers 13 may have a thickness of approximately 40 nm, and the second semiconductor layers 14 may have a thickness of approximately 20 nm.

The first and second semiconductor layers 13 and 14 and the sacrificial semiconductor layers 12 forming the stack body SB may be formed by an epitaxial growth process individually. For example, the first semiconductor layers 13, the second semiconductor layers 14, and the sacrificial semiconductor layers 12 may be formed of a monocrystalline semiconductor or a monocrystalline semiconductor compound. According to the embodiments of the present invention, the first and second semiconductor layers 13 and 14 may include a first semiconductor material selected among monocrystalline silicon and monocrystalline silicon germanium, and the sacrificial semiconductor layers 12 may include a second semiconductor material which is different from the first semiconductor material. For example, each of the first and second semiconductor layers 13 and 14 may be a monocrystalline silicon layer, and the sacrificial semiconductor layers 12 may be a monocrystalline silicon germanium layer.

As described above, epitaxial growth may be used to form the stack body SB. The stack body SB may be formed by repeatedly forming a plurality of sub-stacks. For example, each sub-stack may be formed by stacking the sacrificial semiconductor layer 12, the first semiconductor layer 13, the sacrificial semiconductor layer 12, and the second semiconductor layer 14 in the mentioned order.

Figure 8:
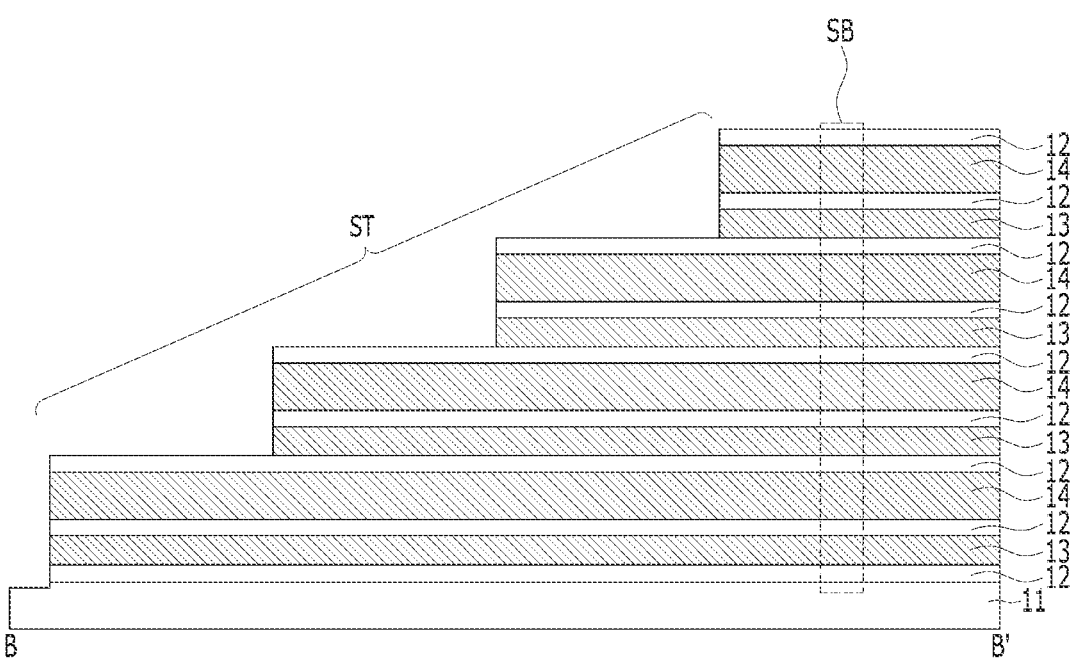

Referring to FIG. 8, a portion of the stack body SB may be etched to form a stepped structure ST. A portion of the stack body SB may be etched using a plurality of photoresist patterns as an etch mask to form the stepped structure ST. For example, in order to form a plurality of photoresist patterns, a patterning process of a photoresist and a slimming process may be alternately performed a plurality of times. The stepped structure ST may include a plurality of steps, and each step may be formed by stacking the sacrificial semiconductor layer 12, the first semiconductor layer 13, the sacrificial semiconductor layer 12, the second semiconductor layer 14, and the sacrificial semiconductor layer 12 in the mentioned order.

Figure 9:
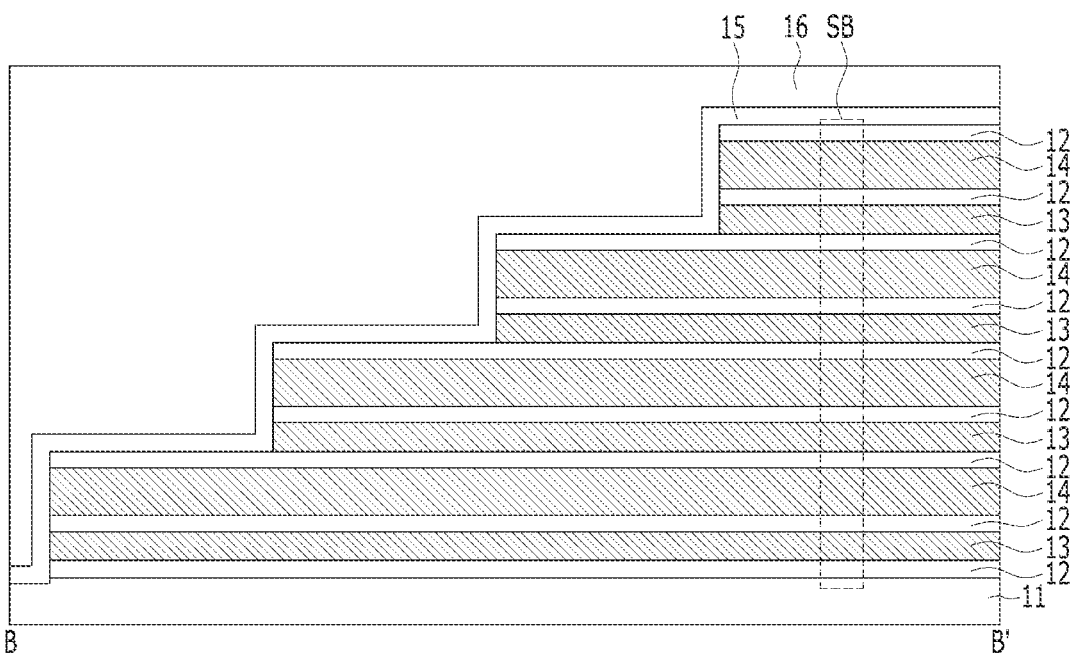

Referring to FIG. 9, a passivation layer 15 and an inter-layer dielectric layer 16 may be sequentially formed over the stepped structure ST. The passivation layer 15 and the inter-layer dielectric layer 16 may include a dielectric material. For example, the passivation layer 15 may include silicon nitride, and the inter-layer dielectric layer 16 may include silicon oxide. The passivation layer 15 and the inter-layer dielectric layer 16 may extend to cover the uppermost sacrificial semiconductor layer 12 of the stack body SB while covering the stepped structure ST.

Figure 10:
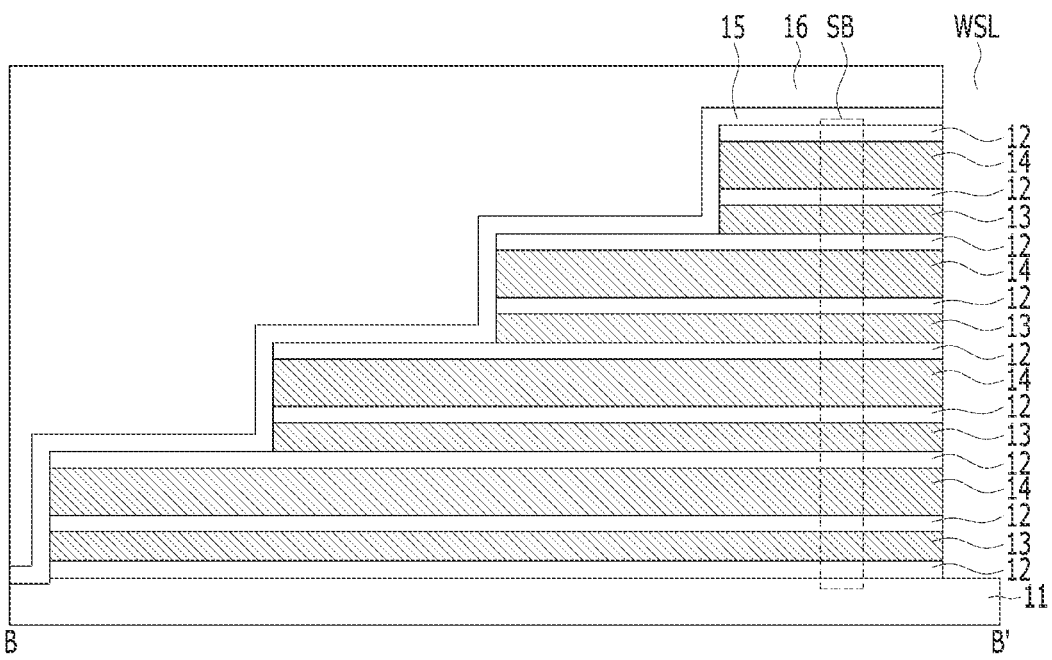

Referring to FIG. 10, a slit-type opening WSL may be formed in the stack body SB. A portion of the stack body SB may be etched to form the slit-type opening WSL. The bottom surface of the slit-type opening WSL may extend into the substrate 11, The slit-type opening WSL may refer to a space in which the word line separation slit ISM as described above with reference to FIG. 3 is to be formed, Before the slit-type opening WSL is formed, as described above with reference to FIG. 3, large slits LSL1 and LSL2 and small slits SSL11 to SSL13 and SSL21 to SSL23 may be formed.

Figure 11:
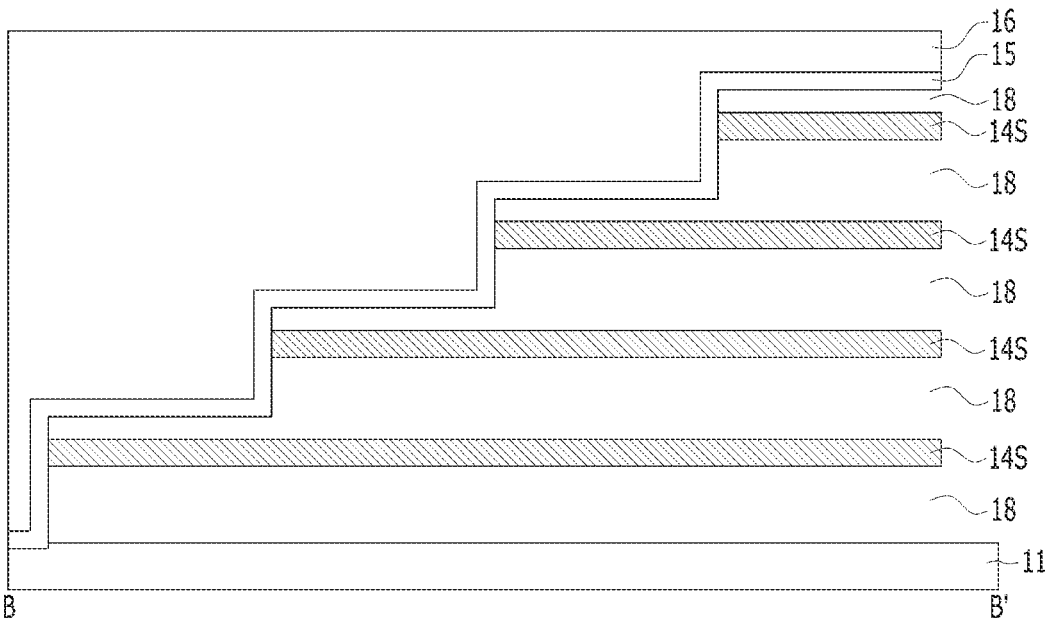

Referring to FIG. 11, semiconductor layer patterns 14S may be formed. The semiconductor layer patterns 14S may be formed by selectively etching the second semiconductor layers 14. The process of forming the semiconductor layer patterns 14S may include stripping the sacrificial semiconductor layers 12 and stripping the first semiconductor layers 13. Since the first semiconductor layers 13 and the second semiconductor layers 14 are of the same material, the second semiconductor layers 14 may become thin while the first semiconductor layers 13 are stripped. The thin second semiconductor layers 14 may form the semiconductor layer patterns 14S.

The sacrificial semiconductor layers 12 may be selectively stripped based on the difference in etch selectivity between the first and second semiconductor layers 13 and 14 and the sacrificial semiconductor layers 12. In order to selectively remove the sacrificial semiconductor layers 12, wet etching or dry etching may be used. For example, when the sacrificial semiconductor layers 12 include a silicon germanium layer and the first and second semiconductor layers 13 and 14 include a monocrystalline silicon layer, the silicon germanium layers may be etched using an etchant or an etching gas having a selectivity with respect to the monocrystalline silicon layers.

The process for forming the semiconductor layer patterns 14S may include a recess process or a thinning process of the first and second semiconductor layers 13 and 14.

A plurality of horizontal recesses 18 may be formed between the semiconductor layer patterns 14S, and the uppermost horizontal recess 18 among the horizontal recesses 18 may be lower than the horizontal recesses 18 of the other levels in height.

Figure 12:
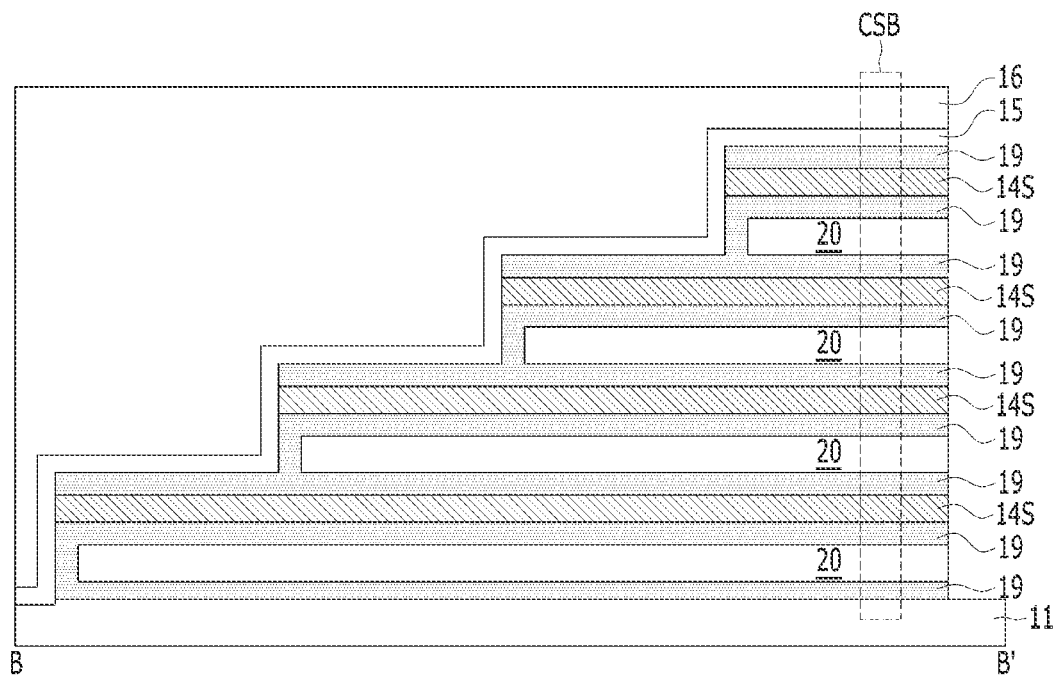

Referring to FIG. 12, the horizontal recesses 18 may be filled with dielectric materials 19 and 20. The dielectric materials 19 and may include sacrificial dielectric layers 19 and cell isolation dielectric layers 20. First, the sacrificial dielectric layers 19 may be formed to cover the semiconductor layer patterns 14S, and the cell isolation dielectric layers 20 may be continuously formed over the sacrificial dielectric layers 19, The semiconductor layer patterns 14S and the sacrificial dielectric layers 19 may directly contact each other. The sacrificial dielectric layers 19 and the cell isolation dielectric layers may be formed of different materials. The sacrificial dielectric layers 19 may include silicon nitride, and the cell isolation dielectric layers 20 may include silicon oxide. The cell isolation dielectric layers may correspond to the horizontal-level dielectric layers IL, which is described above by referring to FIGS. 1 to 6.

As described above, as the sacrificial dielectric layers 19 and the cell isolation dielectric layers 20 are formed, a cell stack body CSB may be formed over the substrate 11. The cell stack body CSB may include a plurality of semiconductor layer patterns 14S, a plurality of sacrificial dielectric layers 19, and a plurality of cell isolation dielectric layers 20. Since the cell isolation dielectric layers 20, the sacrificial dielectric layers 19, and the semiconductor layer patterns 14S include silicon oxide, silicon nitride, and monocrystalline silicon layers, respectively, the cell stack body CSB may have a structure in which an ONSN (Oxide-Nitride-Silicon-Nitride) stack is stacked multiple times. The cell stack body CSB may be formed by repeatedly stacking a plurality of sub-stacks. Here, each sub-stack may include two sacrificial dielectric layers 19 disposed between two cell isolation dielectric layers 20, and one semiconductor layer pattern 14S between the sacrificial dielectric layers 19. Each sub-stack may include a first cell isolation dielectric layer 20, a first sacrificial dielectric layer 19, a semiconductor layer pattern 14S, a second sacrificial dielectric layer 19, and a second cell isolation dielectric layer 20.

Figure 13:
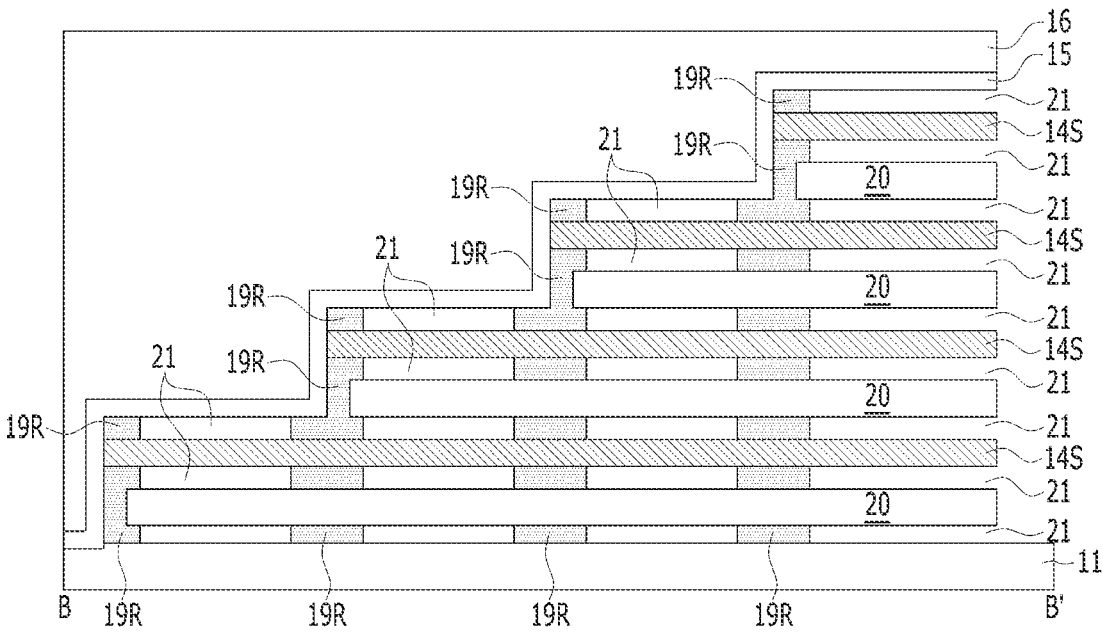

Referring to FIG. 13, word line recesses 21 may be formed in the cell stack body CSB, To form the word line recesses 21, portions of a plurality of the sacrificial dielectric layers 19 may be selectively etched. The word line recess 21 may also be formed between the substrate 11 and the lowermost cell isolation dielectric layer 20.

A portion of the semiconductor layer patterns 14S may be exposed by the word line recesses 21.

After the word line recesses 21 are formed, the remaining sacrificial dielectric layers 19 may become bridge prevention layers 19R. The bridge prevention layers 19R may be silicon nitride. The bridge prevention layers 19R may cover one end of a first side of the cell isolation dielectric layers 20. The bridge prevention layers 19R may prevent the vertically disposed word line recesses 21 from contacting each other.

In order to form the word line recesses 21, the sacrificial dielectric layers 19 may be etched in the second direction D2 from the space where the word line separation slit WSM as described above with reference to FIG. 3 is to be formed.

Figure 14:
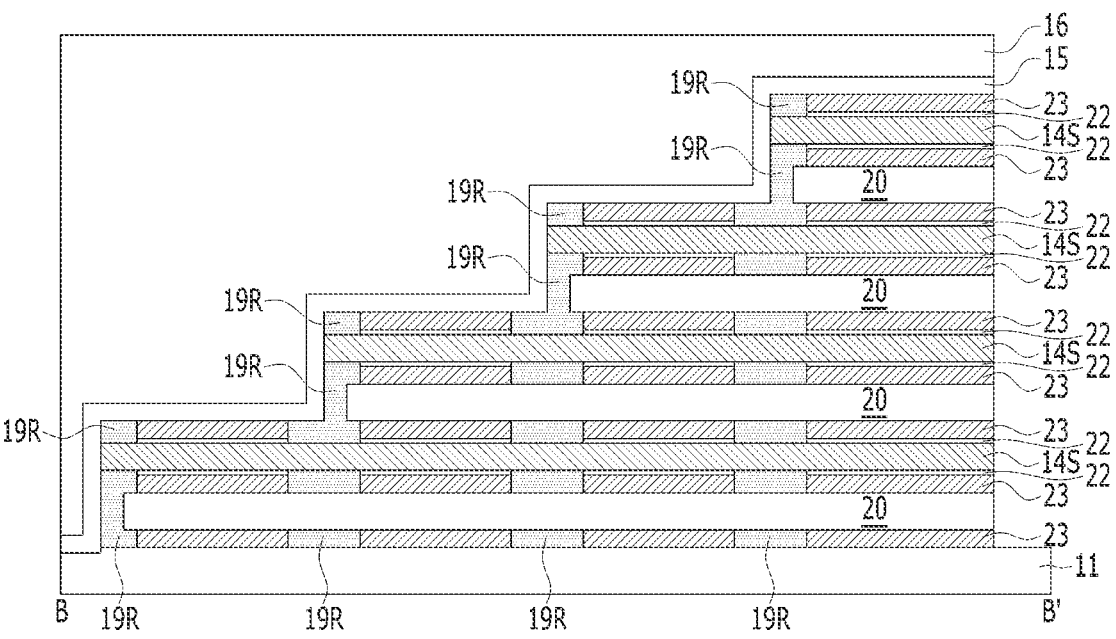

Referring to FIG. 14, a gate dielectric layer 22 may be formed over the exposed portions of the semiconductor layer patterns 14S. The gate dielectric layer 22 may be selectively formed on the surfaces of the semiconductor layer patterns 14S by an oxidation process, According to another embodiment of the present invention, the gate dielectric layer 22 may be formed by a deposition process. In this case, the gate dielectric layer 22 may be formed on the surface of the word line recesses 21 and the surface of the semiconductor layer patterns 14S.

Subsequently, word lines 23 may be formed by filling the word line recesses 21 with a conductive material. The word lines 23 may include polysilicon, titanium nitride, tungsten, or a combination thereof. For example, the process of forming the word lines 23 may include conformally depositing titanium nitride, depositing tungsten over the titanium nitride to fill the word line recesses 21, and etching back the titanium nitride and the tungsten. The word lines 23 may have a double structure with the semiconductor layer patterns 14S interposed therebetween.

Among the word lines 23, the word line 23 formed over the substrate 11 may be a dummy word line.

Figure 15:
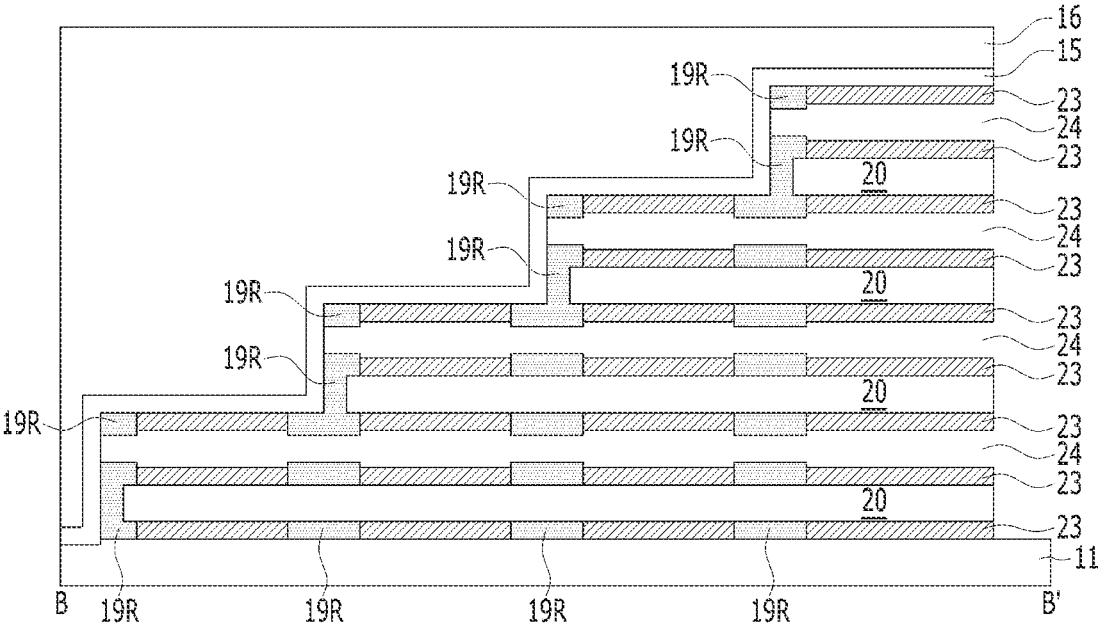

Referring to FIG. 15, the gate dielectric layer 22 and the semiconductor layer patterns 14S may be removed to form pad-type openings 24.

Bridge prevention layers 19R may prevent the vertically disposed pad-type openings 24 from contacting each other.

Figure 16:
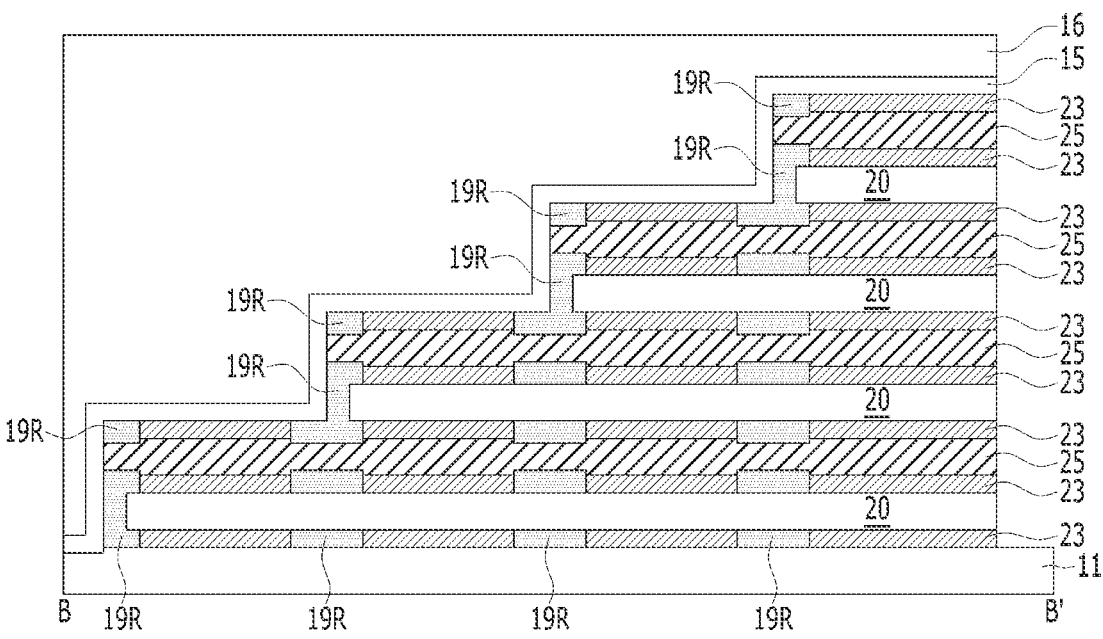

Referring to FIG. 16, pads 25 filling the pad-type openings 24 may be formed. The pads 25 may include a conductive material. The pads 25 may be thicker than the word lines 23. The pads 25 and the word lines 23 may be formed of the same material. The pads 25 may include a metal-based material. The pads 25 may include, for example, titanium nitride, tungsten, or a combination thereof.

The pads 25 and the word lines 23 may form the word line pad portions WLE11 to WLE24, which are described above with reference to FIG. 4.

As described above, since thick word line pad portions are formed by replacing the semiconductor layer patterns 14S between the word lines 23 with the pads 25, the word line resistance may be improved.

Figure 17:
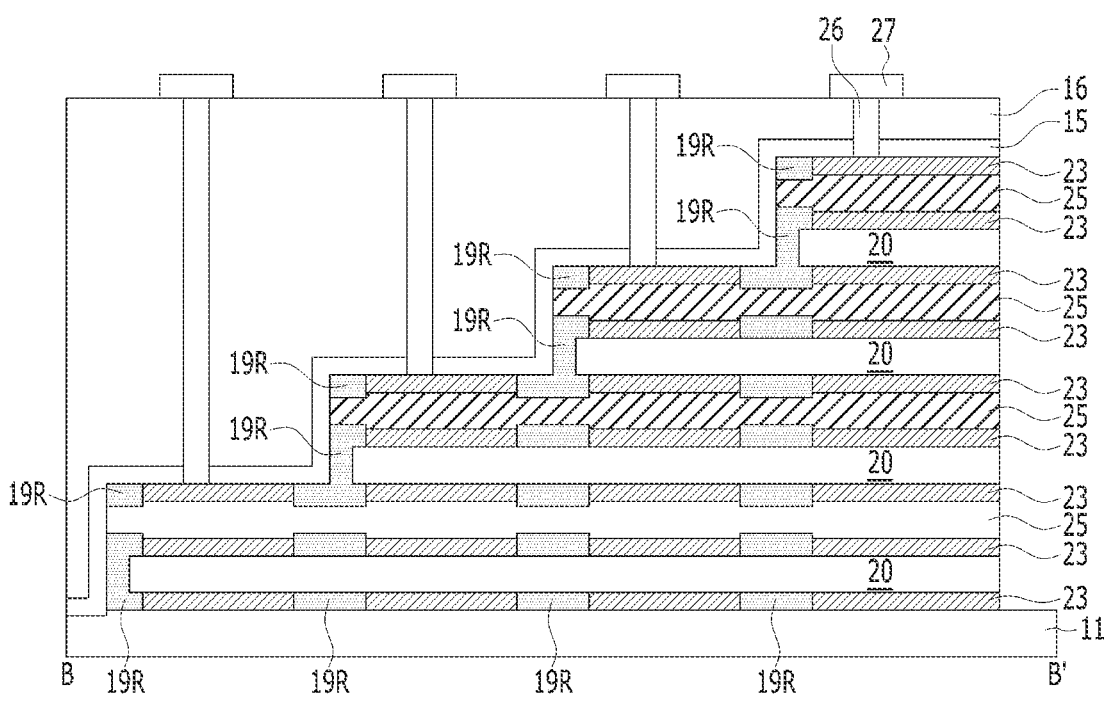

Referring to FIG. 17, contact plugs 26 and metal interconnections 27 respectively coupled to the word lines 23 may be formed.

Referring to FIGS. 7 to 17, the semiconductor device may include a word line stack including a plurality of the word lines 23 stacked over a lower structure including a substrate 11 in a direction perpendicular to the surface of the lower structure, a word line pad portion defined at an end of the word line stack, the horizontal-level dielectric layers 20 disposed between the word line pad portions, the bridge prevention layers 19R disposed between the word line pad portions, and covering the ends of the horizontal-level dielectric layers and contact plugs 26 respectively coupled to the word line pad portions.

According to an embodiment of the present invention, word line resistance may be improved by replacing the active layers between the word lines with word line pads to form thick word line pads.

According to an embodiment of the present invention, reliability may be improved by preventing a short between the word line pad portions by using bridge prevention layers.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:

N word line pad portions stacked over a lower structure in a direction perpendicular to a surface of the lower structure;

dielectric layers disposed between the word line pad portions; and bridge prevention layers disposed between the word line pad portions and covering ends of the dielectric layers, wherein the word line pad portions include an $i^{th}$ word line pad portion and an $(i+1)^{th}$ word line pad portion directly stacked over the $i^{th}$ word line pad portion, where i is an integer from 1 to N−1;

wherein each of the $i^{th}$ and $(i+1)^{th}$ word line pad portions includes a lower-level word line and an upper-level word line formed over the lower-level word line, each of the bridge prevention layers covers a first lateral side of the lower-level word line of included in the $(i+1)^{th}$ word line pad portion and the first lateral side of the upper-level word line of included in the $i^{th}$ word line pad portion.

2. The semiconductor device of claim 1, wherein the word line pad portions include a stepped structure.

3. The semiconductor device of claim 1, wherein the bridge prevention layers are disposed at respective ends of the word line pad portions.

4. The semiconductor device of claim 1, wherein ends of the word line pad portions have a step shape.

5. The semiconductor device of claim 1, wherein the bridge prevention layers include a dielectric material.

6. The semiconductor device of claim 1, wherein each of the $(i+1)^{th}$ and $i^{th}$ word line pad portions further includes a pad including a metal-based material and disposed between the upper-level word line and the lower-level word line.

7. The semiconductor device of claim 6, wherein an end of the pad has a shape that protrudes beyond ends of the upper-level and lower-level word lines.

8. The semiconductor device of claim 6, wherein the pad is thicker than the upper-level and lower-level word lines.

9. The semiconductor device of claim 1, further comprising:

a passivation layer that covers respective ends of the word line pad portions and the bridge prevention layers.

10. The semiconductor device of claim 9, wherein the bridge prevention layers and the passivation layer include the same material.

11. The semiconductor device of claim 1, wherein each of the upper-level and lower-level word lines includes a plurality of segments arranged in the direction perpendicular to the surface of the lower structure.

12. The semiconductor device of claim 11, further comprising:

additional bridge prevention layers alternately arranged between the segments.

13. The semiconductor device of claim 1, wherein the bridge prevention layers cover an end of the upper-level and lower-level word lines.

14. The semiconductor device of claim 1, wherein the bridge prevention layers include silicon nitride (SiN).

15. The semiconductor device of claim 1, wherein the lower-level word line included in the $(i+1)^{th}$ word line pad portion is formed over the upper-level word line included in the $i^{th}$ word line pad portion.

16. A semiconductor device, comprising:

a word line stack including a plurality of word lines stacked over a lower structure in a direction perpendicular to a surface of the lower structure;

N word line pad portions defined at an end of the word line stack;

dielectric layers disposed between the word line pad portions;

bridge prevention layers disposed between the word line pad portions and covering ends of the dielectric layers; and contact plugs respectively coupled to the word line pad portions, wherein the N word line pad portions include an $i^{th}$ word line pad portion and an $(i+1)^{th}$ word line pad portion directly stacked over the $i^{th}$ word line pad portion, where i is an integer from 1 to N−1;

wherein each of the $i^{th}$ and $(i+1)^{th}$ word line pad portions includes a lower-level word line and an upper-level word line formed over the lower-level word line, each of the bridge prevention layers covers a first lateral side of the lower-level word line included in the $(i+1)^{th}$ word line pad portion and the first lateral side of the upper-level word line included in the $i^{th}$ word line pad portion.

17. The semiconductor device of claim 16, wherein the word line pad portions include a stepped structure.

18. The semiconductor device of claim 16, wherein the bridge prevention layers are disposed at ends of the word line pad portions.

19. The semiconductor device of claim 16, wherein ends of the word line pad portions have a step shape.

20. The semiconductor device of claim 16, wherein the bridge prevention layers include a dielectric material.

21. The semiconductor device of claim 16, wherein each of the $(i+1)^{th}$ and $i^{th}$ word line pad portions further includes a pad including a metal-based material, and disposed between the upper-level word line and the lower-level word line.

22. The semiconductor device of claim 16, further comprising:

a passivation layer that covers respective ends of the word line pad portions and the bridge prevention layers.

23. The semiconductor device of claim 16, further comprising:

active layers extending in a direction crossing the word lines;

a bit line commonly coupled to one side of the active layers and extending perpendicularly to the lower structure; and a capacitor coupled to another side of each of the active layers.

* * * * *